United States Patent [19]

Nishihama

[11] 4,324,487

[45] Apr. 13, 1982

[54] FILM SUCTION PLATE FOR A PROCESS CAMERA

[75] Inventor: Takamichi Nishihama, Hikone, Japan

[73] Assignee: Dainippon Screen Seizo Kabushiki Kaisha, Japan

[21] Appl. No.: 229,464

[22] Filed: Jan. 29, 1981

[30] Foreign Application Priority Data

Feb. 21, 1980 [JP] Japan .................................. 55-19714

[51] Int. Cl.³ ........................ G03B 17/26; G03B 27/60
[52] U.S. Cl. ........................................ 355/73; 354/276
[58] Field of Search ..................... 355/73, 76; 354/203, 354/276

[56] References Cited

U.S. PATENT DOCUMENTS

| | | | |
|---|---|---|---|
| 2,078,741 | 4/1937 | Stenmark | 354/276 |
| 2,519,610 | 8/1950 | Sussin | 355/73 |
| 2,717,756 | 9/1955 | Keeshan et al. | 355/76 X |
| 2,799,205 | 7/1957 | Bacsik | 355/76 |
| 3,077,141 | 2/1963 | Wanielista et al. | 355/73 |
| 3,222,051 | 12/1965 | Bevilacqua et al. | 355/76 X |

Primary Examiner—Donald A. Griffin
Attorney, Agent, or Firm—Ostrolenk, Faber, Gerb & Soffen

[57] ABSTRACT

A film suction plate for a process camera, wherein a base plate having a suction pipe in its center and a perforated plate having a plurality of small suction holes are mounted to the rear and the front of a base frame so as to compose a box-shape, and wherein corrugated plates are mounted between the base plate and the perforated plate so that tops and bottoms of the corrugated plates may be arranged concentrically and so that ventilating paths whose widths are widened gradually from the edges of the base plate toward the suction pipe, may be formed in spaces between the corrugated plates, thereby holding any size of film onto the film suction plate without any trouble.

5 Claims, 4 Drawing Figures

FILM SUCTION PLATE FOR A PROCESS CAMERA

BACKGROUND OF THE INVENTION

This invention relates to a film suction plate for a process camera, on which various sizes of films may be held by using a suction means such as a vacuum pump connected to the film suction plate.

A conventional film suction plate is shown in FIGS. 1 and 2. A base plate 1 of an aluminum casting, or the like, is provided concentrically with a plurality of rectangular frame-shape ventilating grooves 2 in its front surface. The grooved front surface of the base plate 1 is covered by a perforated plate 4 having a plurality of small suction holes 3 which are aligned along the ventilating grooves 2. Each ventilating groove 2 is open to the rear surface of the base plate 1 via an opening 5. The openings 5 are connected to a suction means (not shown) such as a vacuum pump, or the like, via a suction area switch valve means 6 and a suction pipe 7. The suction area switch valve means 6 is adapted to open or close each opening 5.

However, this conventional film suction plate has disadvantages and inconveniences. For example, the production of the base plate 1 requires a lot of time and labor, and thus it costs high. The base plate 1 is large and heavy, and accordingly it is inconvenient to handle it. Further, the suction area of the surface of the base plate 1 is changed by the suction area switch valve means 6 depending on the size of each film to be held.

SUMMARY OF THE INVENTION

Therefore, it is an object of the present invention to provide a film suction plate for a process camera free from the abovementioned disadvantages and inconveniences, which is simple, reliable and light-weight, which is easily produced, and which does not require a suction area switch valve means of a conventional one and is capable of holding a film tightly without any trouble.

According to the present invention there is provided a film suction plate for a process camera, comprising a base frame, a base plate having a suction pipe in its center, which is mounted to the rear of the base frame, a perforated plate having a plurality of small holes, which is mounted to the front of the base frame so that the base frame, the base plate and the perforated plate may compose a box-shape, and corrugated plates which are mounted between the base plate and the perforated plate so that tops and bottoms of the corrugated plates may be arranged concentrically and so that ventilating paths whose widths are widened gradually from the edges of the base plate toward the suction pipe, may be formed in spaces between the corrugated plates.

BRIEF DESCRIPTION OF THE DRAWINGS

In order that the present invention may be better understood, a preferred embodiment thereof will be described with reference to the accompanying drawings, in which.

DESCRIPTION OF A PREFERRED EMBODIMENT

Figure 1:
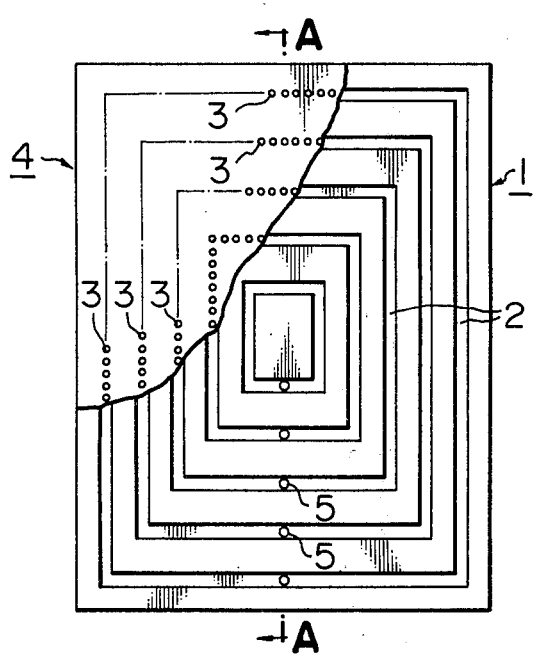
FIG. 1 is a top plan view, partly broken, of a conventional film suction plate for a process camera.
Figure 2:
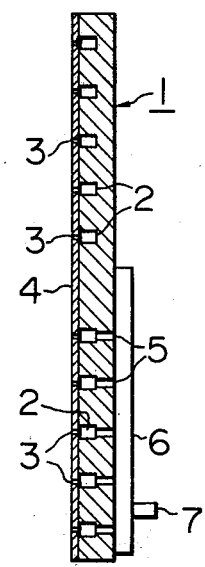
FIG. 2 is a cross-sectional view, taken along the line A—A in FIG. 1.
Figure 3:
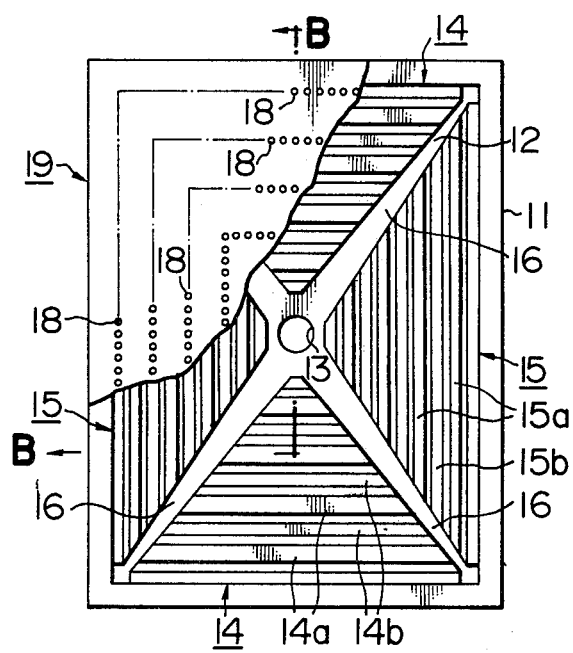
FIG. 3 is a top plan view, partly broken, of a film suction plate for a process camera according to the present invention.
Figure 4:
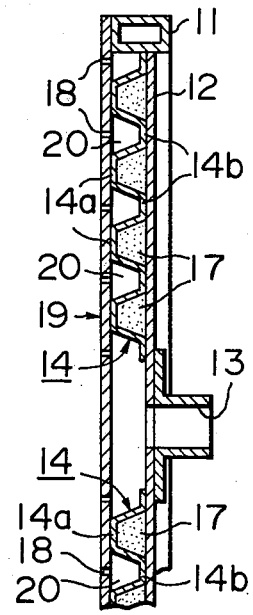
FIG. 4 is an enlarged cross-sectional view, taken along the line B—B in FIG. 3.

There is shown in FIGS. 3 and 4 a film suction plate for a process camera according to the present invention. Rear inside of a base frame 11 consisting of a square tube, a base plate 12 is secured, and a suction pipe 13 is mounted to the center of the rear surface of the base plate 12.

Two pairs of triangular corrugated plates 14 and 15 are mounted to upper, lower, left and right sides of the front surface of the base plate 12 so that main ventilating paths 16 which extend along diagonal lines of the base plate 12 and whose widths are widened gradually from the corners to the suction pipe 13 positioned in the center of the base plate 12, may be formed in the spaces between the triangular corrugated plates 14 and 15.

Flat tops 14a and 15a and flat bottoms 14b and 15b of the corrugated plates 14 and 15 are parallel to one another. The flat tops 14a and 15a are positioned in the same plane as the front surface of the base frame 12, and the flat bottoms 14b and 15b are contacted to the base plate 12. The numbers of the tops and the bottoms of each corrugated plate 14 or 15 are the same, and the tops 14a and 15a are positioned at certain distances away from the center of the base plate 12 so that various sizes of films may be held.

In vacancies between the base plate 12 and the corrugated plates 14 and 15, light-weight elastic material 17 such as a foamed plastic, or the like, is filled up.

A perforated plate 19 having a plurality of small suction holes 18 aligned along the bottoms 14b and 15b, i.e. ventilating grooves 20 between the tops 14a and 15a, is attached to the front surface of the base frame 11 and the flat tops 14a and 15a of the corrugated plates 14 and 15 by an adhesive, or the like.

In this case, when the film suction plate described above is evacuated from the suction pipe 13 by the suction means (not shown), since the base plate 12 and the bottoms 14b and 15b of the corrugated plates 14 and 15 are connected tightly, the air is sucked through the suction holes 18 of the perforated plate 19, the ventilating grooves 20 and the main ventilating paths 16. Hence, the film having almost the same size as that of the perforated plate 19 is sucked and held onto the perforated plate 19 in the same manner as the conventional film suction plate.

In this embodiment, since the main ventilating paths 16 are gradually narrowed from the center of the base plate 12 to the four corners thereof and the air-suction distance of a suction hole 18 positioned in the central part of the perforated plate 19 is shorter than that of a suction hole 18 positioned in the edge part of the perforated plate 19, the ventilating resistance of the suction hole 18 positioned in the edge part is larger than that of the one 18 positioned in the central part, that is, the air through the suction hole 18 positioned in the central part is sucked stronger than that through the one 18 positioned in the edge part.

Therefore, when a small size of film is positioned in the central portion of the perforated plate 19, the suction holes 18 positioned in the edge portion thereof are still opened, and, while the air inside the film suction plate is evacuated, the air is sucked into the film suction plate through the suction holes 18 which are not closed by the film. In this case, however, the amount of the air come in the film suction plate is small, and thus the depression of the holding force of the film on the central portion of the base plate 12 is small enough to maintain the holding of the film safely without any trouble.

According to the present invention the corrugated plates 14 and 15 are not restricted to the triangular shapes in order that the main ventilating paths 16 may extend along the diagonal lines of the base plate 12, and the other shapes of the corrugated plates may be selected. In this case, the widths of the main ventilating paths formed in the spaces between the corrugated plates are widened gradually from the edges of the base plate 12 toward the suction pipe.

In this embodiment, in order to connect the corrugated plates 14 and 15 to the base plate 12 an epoxy resin adhesive or the like can be used. The elastic materials 17 ensure the connection between the bottoms 14b and 15b of the corrugated plates 14 and 15 and the base plate 12, and the connection between the tops 14a and 15a of the corrugated plates 14 and 15 and the perforated plate 19 when they are contacted under pressure and are adhered by the adhesive. Further, the elastic materials 17 prevent the air in the film suction plate from the turbulent flow when the film is held by the film suction plate by sucking.

Although the present invention has been described in terms of a preferred embodiment illustrated in the accompanying drawings, however, various changes and modifications can be made by those skilled in the art without departing from the scope of the present invention.

What is claimed is:

1. A film suction plate for a process camera, comprising:
   a base frame;
   a base plate having a suction pipe in its center, which is mounted to the rear of the base frame;
   a perforated plate having a plurality of small holes, which is mounted to the front of the base frame so that the base frame, the base plate and the perforated plate may compose a box-shape; and
   corrugated plates which are mounted between the base plate and the perforated plate so that tops and bottoms of the corrugated plates may be arranged concentrically and so that ventilating paths whose widths are widened gradually from the edges of the base plate toward the suction pipe, may be formed in spaces between the corrugated plates.

2. A film suction plate as defined in claim 1, wherein an elastic material is filled up between the base plate and the corrugated plates.

3. A film suction plate as defined in claim 1 or 2, wherein the corrugated plates are formed in triangular shapes so that the ventilating paths may be extended along the diagonal lines of the base plate.

4. A film suction plate as defined in claim 1 or 2, wherein the small holes of the perforated plate are arranged along the bottoms of the corrugated plates.

5. A film suction plate as defined in claim 4, wherein the base frame is composed of a square tube.

* * * * *